United States Patent
Iino et al.

(10) Patent No.: US 10,801,710 B2
(45) Date of Patent: Oct. 13, 2020

(54) MOUNTING AND WIRING SUBSTRATES FOR LIGHTING DEVICE AND METHOD FOR MANUFACTURING MOUNTING AND WIRING SUBSTRATES FOR LIGHTING DEVICE

(71) Applicants: CITIZEN ELECTRONICS CO., LTD., Yamanashi-ken (JP); CITIZEN WATCH CO., LTD., Tokyo (JP)

(72) Inventors: Takashi Iino, Yamanashi-ken (JP); Sadato Imai, Yamanashi-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 16/098,249

(22) PCT Filed: May 22, 2017

(86) PCT No.: PCT/JP2017/018968
§ 371 (c)(1),
(2) Date: Nov. 1, 2018

(87) PCT Pub. No.: WO2017/204134
PCT Pub. Date: Nov. 30, 2017

(65) Prior Publication Data
US 2019/0162398 A1 May 30, 2019

(30) Foreign Application Priority Data
May 24, 2016 (JP) .................... 2016-102948

(51) Int. Cl.
*F21V 23/00* (2015.01)
*H01L 33/62* (2010.01)
(Continued)

(52) U.S. Cl.
CPC .......... *F21V 23/005* (2013.01); *H01L 27/156* (2013.01); *H01L 33/48* (2013.01);
(Continued)

(58) Field of Classification Search
CPC ..... F21V 23/005; H01L 27/156; H01L 33/54; H01L 33/48; H01L 33/62; H01L 33/64;
(Continued)

(56) References Cited

U.S. PATENT DOCUMENTS

2004/0169451 A1* 9/2004 Oishi ...................... H01L 33/64
313/45
2008/0278917 A1 11/2008 Lin et al.
(Continued)

FOREIGN PATENT DOCUMENTS

EP 2 639 831 9/2013
EP 2 975 655 1/2016
(Continued)

OTHER PUBLICATIONS

International Search Report dated Jul. 25. 2017 in International Application No. PCT/JP2017/018968.
(Continued)

*Primary Examiner* — Thao X Le
*Assistant Examiner* — Gardner W. S. Swan
(74) *Attorney, Agent, or Firm* — Wenderoth, Lind & Ponack, L.L.P.

(57) ABSTRACT

An LED lighting device capable of discharging heat generated from a light emitting element to the outside the LED lighting device. An LED lighting device includes: a plurality of light emitting elements; a mounted substrate on which the light emitting elements are mounted; and an electrode portion configured to supply a current to the light emitting elements from outside the LED lighting device. On the mounted substrate, a wiring substrate is located. On the
(Continued)

upper surface of the mounted substrate, the mounted substrate includes: a light emitting region in which the plurality of light emitting elements are mounted; an exposed region which is located on the outer side of the light emitting region and through which the upper surface of the mounted substrate is exposed; and a wiring region which is located on the outer side of the light emitting region and in which the wiring substrate is located.

11 Claims, 12 Drawing Sheets

(51) Int. Cl.
   *H01L 33/64* (2010.01)
   *H01L 33/48* (2010.01)
   *H01L 27/15* (2006.01)
   *H01L 33/54* (2010.01)

(52) U.S. Cl.
   CPC .............. *H01L 33/54* (2013.01); *H01L 33/62* (2013.01); *H01L 33/64* (2013.01); *H01L 2224/48091* (2013.01); *H01L 2224/48137* (2013.01); *H01L 2924/181* (2013.01)

(58) Field of Classification Search
   CPC . H01L 2224/48091; H01L 2224/48137; H01L 2924/181
   See application file for complete search history.

(56) References Cited

U.S. PATENT DOCUMENTS

| | | | |
|---|---|---|---|
| 2011/0180817 A1* | 7/2011 | Ishizaki | .................... F21V 3/00 257/88 |
| 2013/0141891 A1 | 6/2013 | Funakubo | |
| 2014/0217433 A1 | 8/2014 | Tudorica et al. | |
| 2014/0284651 A1 | 9/2014 | Tsuchiya et al. | |
| 2015/0016107 A1 | 1/2015 | Wimmer et al. | |
| 2016/0172564 A1 | 6/2016 | Yamaguchi et al. | |

FOREIGN PATENT DOCUMENTS

| | | |
|---|---|---|
| JP | 2008-277817 | 11/2008 |
| JP | 2013-021042 | 1/2013 |
| JP | 2013-118292 | 6/2013 |
| JP | WO2014/065068 | 5/2014 |
| JP | 2014-187305 | 10/2014 |

OTHER PUBLICATIONS

International Preliminary Report on Patentability dated Oct. 1, 2018 in International Application No. PCT/JP2017/018968.
Extended European Search Report dated Dec. 2, 2019 in European Patent Application No. 17802726.4.

* cited by examiner

MOUNTING AND WIRING SUBSTRATES FOR LIGHTING DEVICE AND METHOD FOR MANUFACTURING MOUNTING AND WIRING SUBSTRATES FOR LIGHTING DEVICE

TECHNICAL FIELD

The present application relates to an LED lighting device mountable on various lighting appliances, and relates to a method for manufacturing the LED lighting device.

BACKGROUND ART

In recent years, lighting devices using a plurality of light emitting elements (LED) have been employed as lighting-purpose light sources to replace light bulbs and fluorescent lights. Light emitting elements are less power consuming than light bulbs and other light sources. However, light emitting elements have lower directivity because light emitting elements are punctiform light sources. In order to secure brightness high enough for lighting purposes in lighting devices using light emitting elements, some tens to hundreds of light emitting elements are sealed with light-transmitting resin. In this manner, lighting devices using light emitting elements form light emitting surfaces of uniform brightness.

JP 2013-118292A and JP 2008-277817A disclose LED lighting devices each having a light emitting surface on which a plurality of light emitting elements are mounted. Each of these LED lighting devices includes a circular mounted portion on a substrate. On the mounted portion, the plurality of light emitting elements are mountable. The plurality of light emitting elements mounted on the mounted portion are sealed with a light-transmitting resin material. As light emitting elements used in general lighting applications, blue light emitting elements, UV elements, and other elements that easily make white luminescent colors are employed in many of the applications. These light emitting elements are sealed on the substrate with a resin material such as silicone.

DISCLOSURE OF THE INVENTION

Problems to be Solved by the Invention

As the type of the above-described LED lighting devices become higher brightness type, the number of light emitting elements mounted increases, and the amount of heat generation increases accordingly. In view of this, a metal material, a ceramics material, or another material that has high thermal conductivity is used as a mounted substrate on which light emitting elements are mounted. This provides the mounted substrate with a predetermined heat discharge property. Even when this kind of mounted substrates having high thermal conductivity are used, it is necessary to provide a wiring substrate that includes an electrode portion on the outer side of the light emitting region in which the plurality of light emitting elements are mounted. The electrode portion makes electrical connections with a mother board and other elements.

However, when a wiring substrate is provided on the mounted substrate, the wiring substrate occupies the upper surface of the mounted substrate excluding the light emitting region. This has caused such a problem that the mounted substrate has an insufficient heat discharge effect. Also, in order to secure space for the wiring substrate on the outer side of the light emitting region, it is necessary to enlarge the size of the mounted substrate itself. This has caused such a problem that an LED lighting device as a whole cannot be made smaller in size.

In view of the circumstances, it is an object of the present application to provide an LED lighting device that includes, on a mounted substrate, an exposed region through which the upper surface of the mounted substrate is exposed. The mounted substrate includes: a light emitting region on which a plurality of light emitting elements are mounted; and a wiring region. Through the exposed region, heat emitted from a light emitting element is released outside the LED lighting device.

Means of Solving the Problems

In order to solve the above-described problems, an LED lighting device according to the present application includes a plurality of light emitting elements, a mounted substrate, and a wiring substrate. On the mounted substrate, the plurality of light emitting elements are mounted. The wiring substrate is located on the mounted substrate and includes an electrode portion configured to supply a current to the light emitting elements from outside the LED lighting device. On an upper surface of the mounted substrate, the mounted substrate includes: a light emitting region in which the plurality of light emitting elements are mounted; an exposed region which is located on an outer side of the light emitting region and through which the upper surface of the mounted substrate is exposed; and a wiring region which is located on the outer side of the light emitting region and in which the wiring substrate is located.

A method according to the present application for manufacturing an LED lighting device is a method for manufacturing the LED lighting device according to the present application, and includes the following three steps. a) an aggregate wiring substrate arranging step of arranging aggregate wiring substrates on an aggregate mounted substrate in a lattice arrangement, each of the aggregate wiring substrates comprising a plurality of the wiring substrates integral to each other. b) an arrangement wiring step of mounting the plurality of light emitting elements between a pair of the electrode portions on the aggregate mounted substrate. c) a cutting step of cutting at least one of the aggregate wiring substrate and the aggregate mounted substrate to obtain an individual LED lighting device.

Effects of the Invention

The LED lighting device according to the present application includes: the exposed region, through which the upper surface of the mounted substrate is exposed; and the wiring region, in which the wiring substrate is located. The exposed region and the wiring region are separate from each other on the outer side of the light emitting region, in which a plurality of light emitting elements are mounted. With this configuration, the LED lighting device according to the present application efficiently discharges heat generated in the light emitting region to outside the LED lighting device through the exposed region. Also, at least a pair of wiring regions are provided on the outer side of the light emitting region, and each wiring region has an area smaller than the area of the exposed region. This further increases the heat discharge effect. Thus, the LED lighting device according to the present application discharges heat not only from the lower surface of the mounted substrate toward the mother board, but also from the upper surface of the mounted substrate directly to external air. This advantageously reduces the amount of heat generation in the light emitting region.

In the method according to the present application for manufacturing an LED lighting device, aggregate wiring substrates each including wiring substrates integral to each other are arranged on an aggregate mounted substrate in a lattice arrangement. Then, at least one of the aggregate wiring substrate and the aggregate mounted substrate is cut to obtain an individual LED lighting device. This ensures efficient manufacturing of the LED lighting device according to the present application.

MODES FOR CARRYING OUT THE INVENTION

Figure 1A:
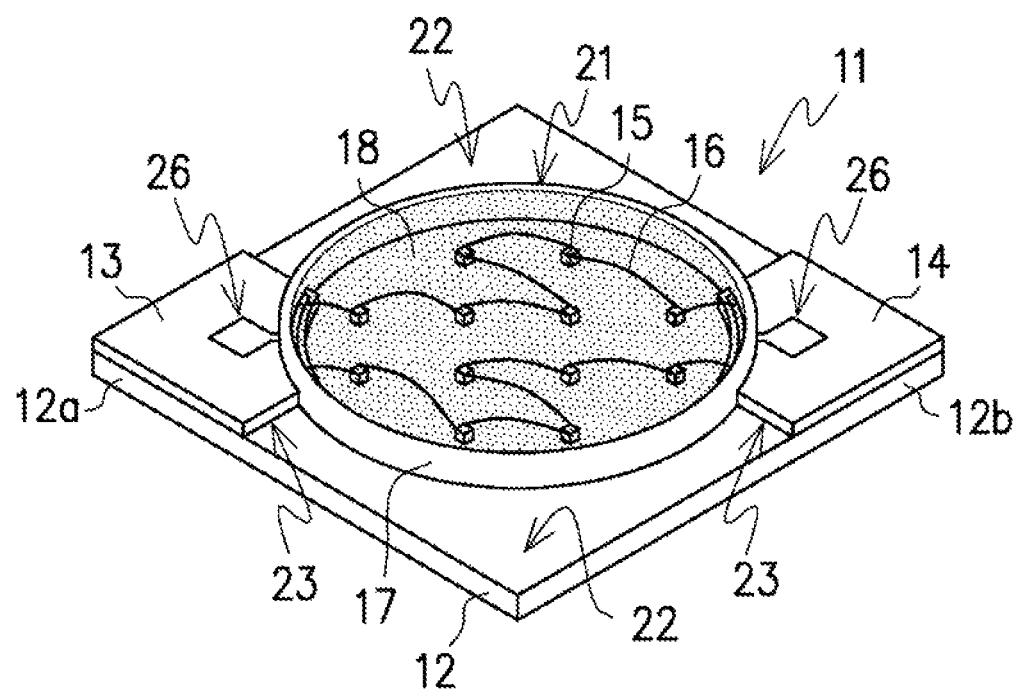
FIG. 1 is a perspective view (a) and a cross-sectional view (b) of an LED lighting device according to a first embodiment.
Figure 1B:
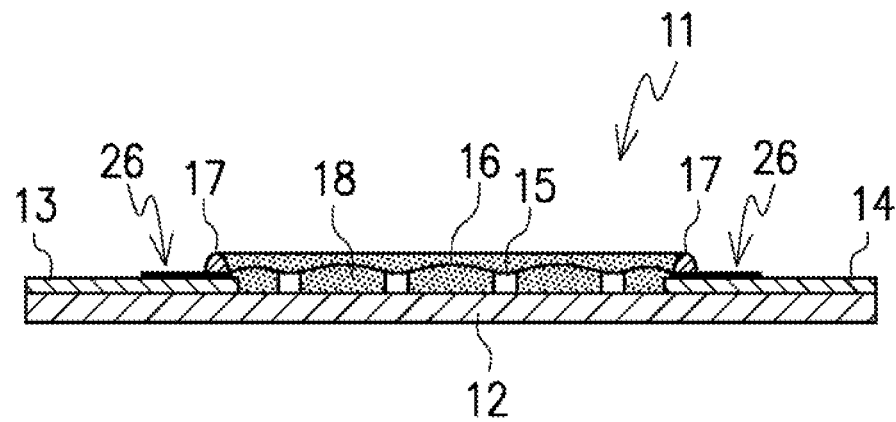

In the following description, the LED lighting device according to the first embodiment of the present application will be described by referring to FIGS. 1 to 4. As illustrated in FIG. 1, an LED lighting device 11 according to this embodiment includes: a rectangular mounted substrate 12; a plurality of light emitting elements 15, which are mounted at a center portion of the mounted substrate 12; and a pair of wiring substrates 13 and 14, which are respectively located at opposite corners 12a and 12b on the mounted substrate 12 and which face each other. On the upper surface of the mounted substrate 12, the mounted substrate 12 includes a light emitting region 21, exposed regions 22, and wiring regions 23.

The light emitting region 21 is a region on the upper surface of the mounted substrate 12, on which the plurality of light emitting elements 15 are mounted. The light emitting region 21 is located at a center portion of the upper surface of the mounted substrate 12. The light emitting region 21 is a region defined within a circular partition frame 17, which is made of a white, light-shielding resin. The plurality of light emitting elements 15 are electrically connected to each other through wires 16. The region defined within the partition frame 17 is filled with a light-transmitting sealing resin 18 so that the plurality of light emitting elements 15 are sealed. The sealing resin 18 may be a silicone resin compatible with the luminescent color of the light emitting elements 15.

In the wiring regions 23, the pair of wiring substrates 13 and 14 are located. The pair of wiring substrates 13 and 14 are respectively located at the opposite corners 12a and 12b on the mounted substrate 12, thereby facing each other. Each of the pair of wiring substrates 13 and 14 includes an arcuate portion that surrounds part of the outer surface of the partition frame 17. The exposed regions 22 are regions that are located on the upper surface of the mounted substrate 12 and that are exposed on the outer side of the light emitting region 21. Specifically, the exposed regions 22 form a range on the upper surface of the mounted substrate 12 obtained by excluding the light emitting region 21 and the pair of wiring regions 23. In this embodiment, a wide range of region is secured for the exposed regions 22, and in order to maximize the heat discharge property of the exposed regions 22, the pair of wiring regions 23 are smaller in area than the exposed regions 22. That is, the total area of the wiring regions 23 is smaller than the area of the exposed regions 22.

Figure 2:
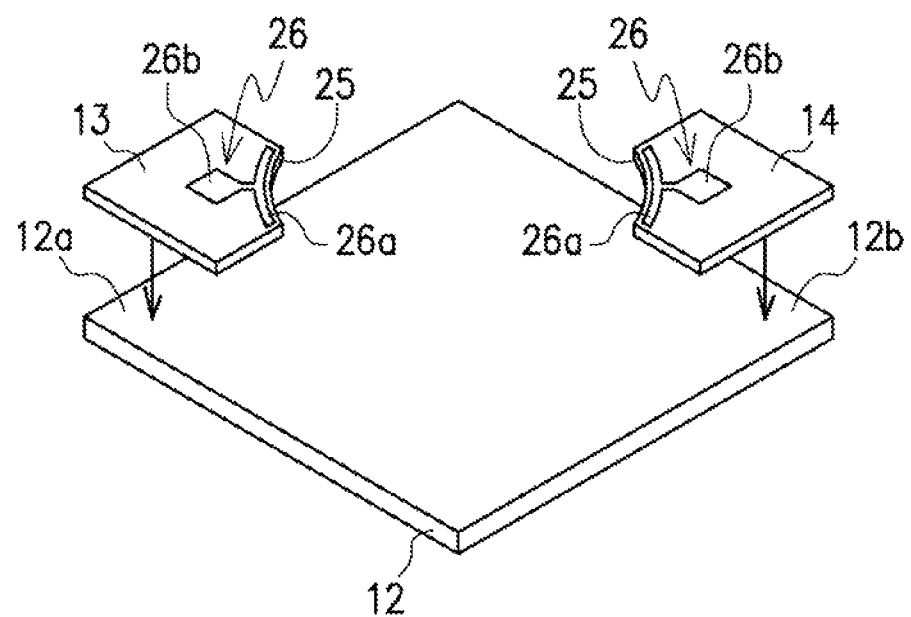
FIG. 2 is a perspective view of a mounted substrate and a wiring substrate according to the first embodiment.
Figure 3:
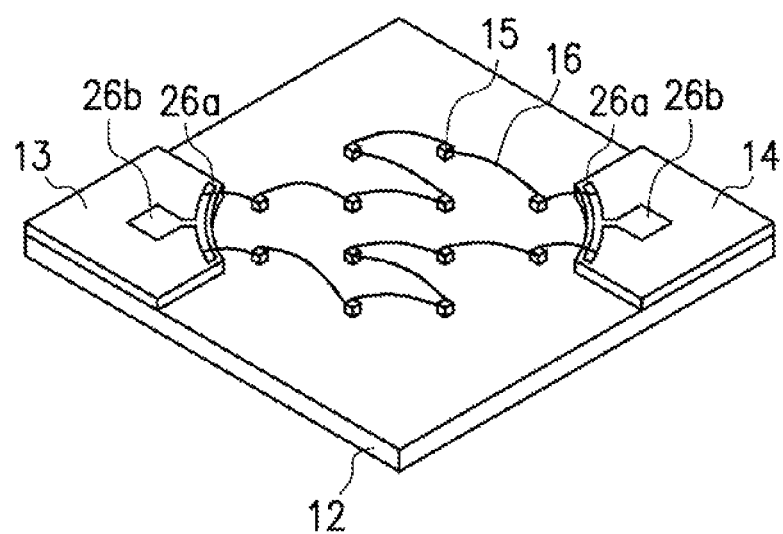
FIG. 3 is a perspective view illustrating an arrangement wiring step of light emitting elements according to the first embodiment.
Figure 4:
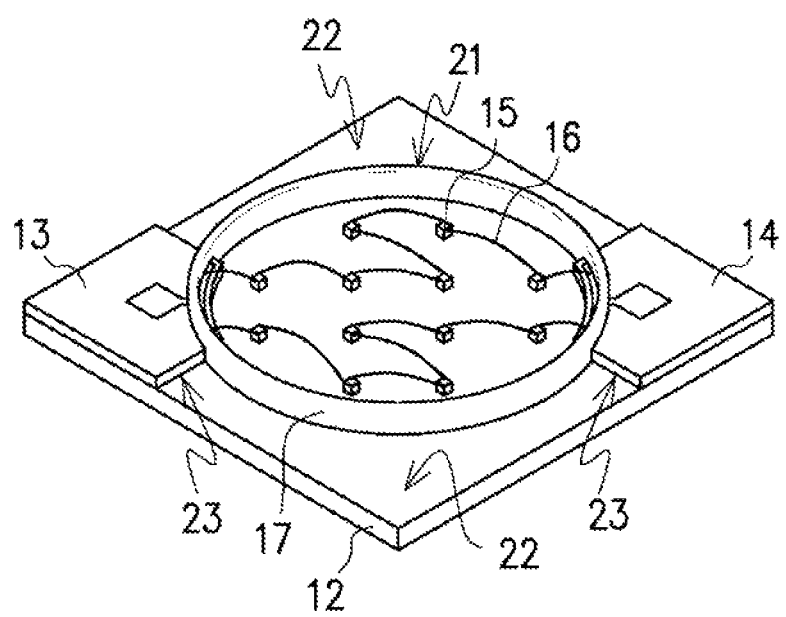
FIG. 4 is a perspective view illustrating a partition frame forming step according to the first embodiment.

FIGS. 2 to 4 illustrate part of the process for manufacturing an individual LED lighting device 11. Depending on the application in which the LED lighting device 11 is used, a metal material or a ceramics material, which have high thermal conductivity, is used as the mounted substrate 12. Suitable examples of the metal material include aluminum and copper. As the ceramics material, a material having a comparatively high thermal conductivity ratio may be used. This provides the mounted substrate 12 with a heat discharge effect and high insulation resistance. Examples of such material include oxidation aluminum, aluminum nitride, and silicon nitride. The above-described examples of the metal material and the ceramics material are not intended in a limiting sense. It is to be noted that while the mounted substrate 12 according to this embodiment is a rectangular plate of some tens of millimeters square, the mounted substrate 12 may be any of other various sizes and shapes as necessitated by, for example, the lighting application and the amount of light emission.

Each of the pair of wiring substrates 13 and 14 is made of an insulating resin material and has a quadrangular shape with an arcuate cutout portion 25. An electrode portion 26 extends between the upper surface of the cutout portion 25 and a center portion of each of the wiring substrates 13 and 14. One of the pair of wiring substrates 13 and 14 is the anode side, and the other wiring substrate is the cathode side. The wiring substrates 13 and 14 are positioned at the opposite corners 12a and 12b on the mounted substrate 12 with the arcuate cutout portions 25 facing each other. Then, the wiring substrates 13 and 14 are fixed to the mounted substrate 12 using an adhesive or another binder.

Each of the electrode portions 26 includes: a first electrode portion 26a, which forms a curve along the upper surface of the arcuate cutout portion 25; and a second electrode portion 26b, which extends between the first electrode portion 26a and the center portion of each of the wiring substrates 13 and 14. The first electrode portion 26a is connected, through the wires 16, to those light emitting elements 15 that are mounted near the wiring substrate on the light emitting region 21. The second electrode portion 26b is connected to one end of a power source line extending from the mother board or another element.

As illustrated in FIG. 3, a plurality of light emitting elements 15 are located at the center portion of the upper surface of the mounted substrate 12. While in FIG. 3 a dozen of light emitting elements 15 are illustrated, some tens of light emitting elements 15 are provided at predetermined spatial intervals in actual situations. The light emitting elements 15 show white luminescent color for general lighting purposes. For the purposes, the light emitting elements 15 are blue light emitting elements of the same size and the same kind of gallium nitride based compound semiconductor. Each of the blue light emitting elements is made up of: a substrate made of sapphire glass; and a diffusion layer obtained by diffusion growth of an n-type semiconductor and a p-type semiconductor on the substrate. On the upper surface of the n-type semiconductor, an n-type electrode is located. On the upper surface of the p-type semiconductor, a p-type electrode is located. The n-type electrode is electrically connected to the p-type electrodes of adjacent light emitting elements 15 through the wires 16. The p-type electrode is electrically connected to the n-type electrodes of adjacent light emitting elements 15 through the wires 16.

In this embodiment, the plurality of light emitting elements 15 are divided into two light emitting groups, and each of the two light emitting groups is positioned and wired on the upper surface of the mounted substrate 12. The light emitting elements 15 of each light emitting group are connected in series to each other between the first electrode portion 26a of the wiring substrate 13 and the first electrode portion 26a of the wiring substrate 14. Through the second electrode portions 26b of the wiring substrates 13 and 14, a predetermined amount of current is applied to the light emitting elements 15 of each light emitting group.

The partition frame 17 is located on the mounted substrate 12 and includes portions that step over the pair of wiring substrates 13 and 14. The partition frame 17 protrudes to a height greater than the height of the light emitting elements 15, which are arranged and wired in the light emitting region 21, and the height of the connection portions at which the light emitting elements 15 are connected to the wires 16. In one example, the partition frame 17 is made of a white resin material. The region defined within the partition frame 17 is filled with the sealing resin 18, which seals the plurality of light emitting elements 15. The sealing resin 18 is formed by containing a fluorescent agent in a transparent resin base material, and has a light-transmitting property. For example, the sealing resin 18 may be formed by mixing, in an epoxy resin or a silicone resin, a suitable amount of yttrium aluminum garnet (YAG), which is material of fluorescent particles, or a suitable amount of fluorescent agent made of a pigment, which is material of coloring matter particles.

In the LED lighting device 11 with the above-described configuration, the pair of wiring substrates 13 and 14 are respectively located at the opposite corners 12a and 12b on the mounted substrate 12. This ensures that a wide range of region is secured for the exposed regions 22, which are regions of the upper surface of the mounted substrate 12 other than the light emitting region 21, which is surrounded by the partition frame 17, and the pair of wiring regions 23. This ensures that heat involved with light emission of the light emitting region 21 is released effectively; that is, the heat is released not only from the lower surface of the mounted substrate 12 but also from the upper surface of the mounted substrate 12 to external air. This increases the heat discharge efficiency of the LED lighting device 11 as a whole.

In this embodiment, the pair of wiring substrates 13 and 14 are respectively located at the opposite corners 12a and 12b on the mounted substrate 12. Insofar as the pair of wiring substrates 13 and 14 are arranged in an opposing arrangement on the outer side of the light emitting region 21, the pair of wiring substrates 13 and 14 may not necessarily be arranged on a diagonal line or at corners. That is, the wiring substrates 13 and 14 may be set at any other positions in accordance with the position of electrode portions located on the side of the mother board (not illustrated), on which the LED lighting device 11 is mounted. Also, an area of the wiring substrates 13 and 14 is sufficient if the area is large enough to form the first electrode portion 26a and the second electrode portion 26b on the wiring substrates 13 and 14. That is, by minimizing the area of the wiring substrates 13 and 14, a large area is secured for the exposed regions 22. With the area of the wiring substrates 13 and 14 minimized, the heat discharge effect of the LED lighting device 11 increases.

In order to minimize the area of the wiring substrates 13 and 14, the wiring substrates 13 and 14 may be formed by cutting portions of the wiring substrates 13 and 14 other than: a portion outlining the first electrode portion 26a, which is formed along part of the partition frame 17; a portion outlining the quadrangular second electrode portion 26b, which is located in a direction toward to the outside of the partition frame 17; and a portion outlining the electrode portion connecting the first electrode portion 26a and the second electrode portion 26b to each other. That is, the outer shapes of the wiring substrates 13 and 14 may be formed along the outer shape of the electrode portion 26. As a result, regions where the mounted substrate 12 is exposed are obtained also on the upper surfaces of the corners 12a and 12b, which are at diagonal positions. With the obtained exposed portion contacting external air, the heat discharge effect of the mounted substrate 12 as a whole increases. The second electrode portion 26b, in particular, generates a large amount of heat when current is applied through the power source line. In this case, the heat is released outside the LED lighting device from the exposed portion of the mounted substrate 12 located around the second electrode portion 26b.

Figure 5A:
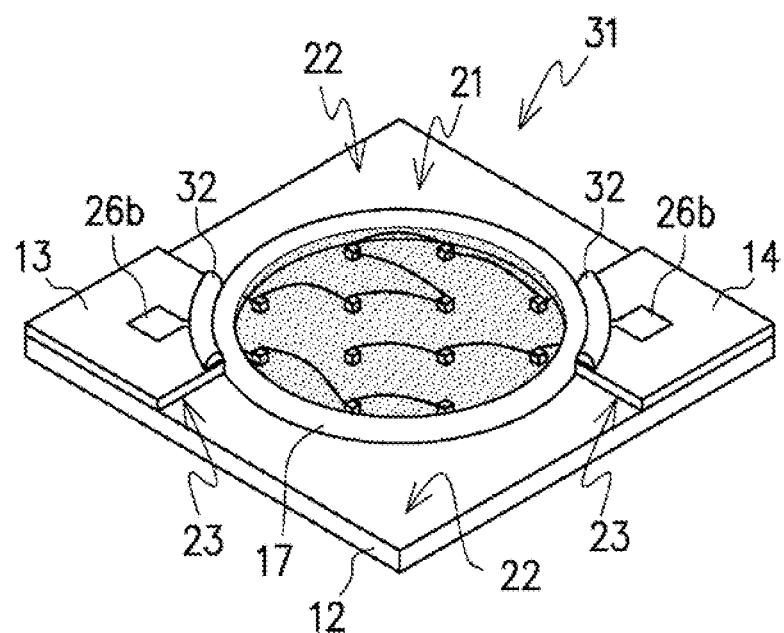
FIG. 5 is a perspective view (a) and a cross-sectional view (b) of an LED lighting device according to a second embodiment.
Figure 5B:
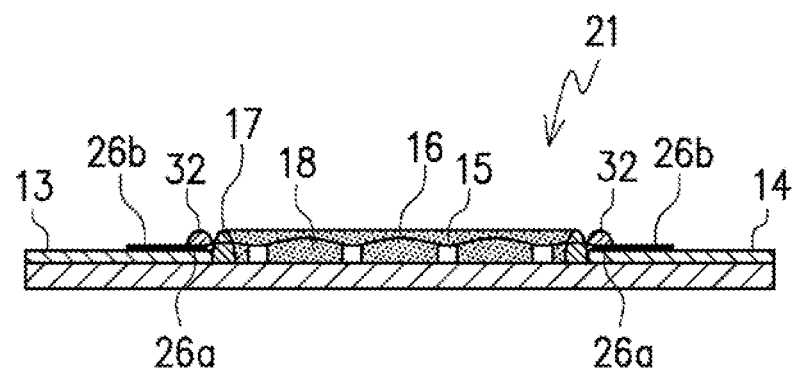
Figure 6:
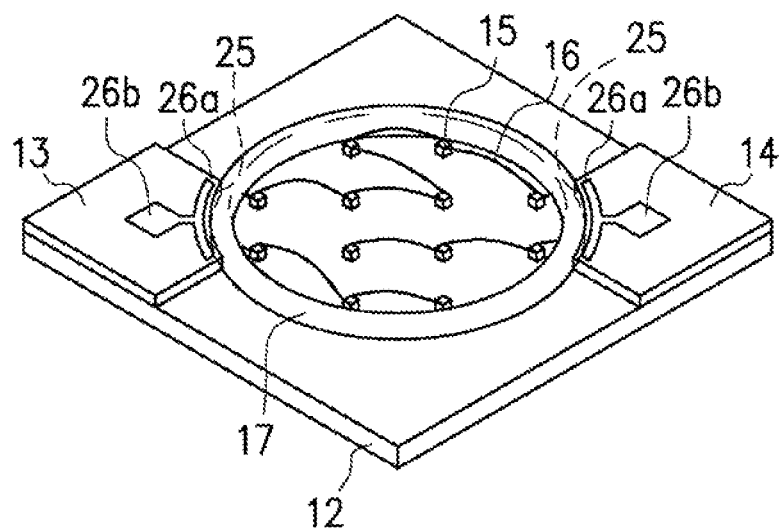
FIG. 6 is a perspective view of a mounted substrate and a wiring substrate according to the second embodiment.

FIGS. 5 and 6 illustrate an LED lighting device 31 according to the second embodiment. It is to be noted that like reference numerals designate corresponding or identical elements throughout the LED lighting device 31 according to this embodiment and the LED lighting device 11 according to the first embodiment, and these elements will not be elaborated upon here. As illustrated in FIG. 6, in the LED lighting device 31 according to this embodiment, a pair of wiring substrates 13 and 14 each include an arcuate cutout portion 25, and are located at opposite corners on the mounted substrate 12, there by facing each other. A partition frame 17 is located along the inner surfaces of the cutout portions 25 of the wiring substrates 13 and 14.

In this embodiment, the partition frame 17 is directly formed on the mounted substrate 12, without stepping over the wiring substrates 13 and 14. This eliminates a step in the partition frame 17, as opposed to the first embodiment. As a result, the plurality of light emitting elements 15 are more reliably sealed by the sealing resin 18. In this embodiment, the wires 16, which extend from the light emitting elements 15 in the light emitting region 21 and are connected to the first electrode portions 26a of the wiring substrates 13 and 14, and the connection portions at which the light emitting elements 15 are connected to the wires 16 are partially exposed beyond the LED lighting device. In view of this, as illustrated in FIG. 5, a cover member 32, which is made of a light-shielding resin material similar to that of the partition frame 17, is preferably used to cover each first electrode portion 26a.

Figure 7:
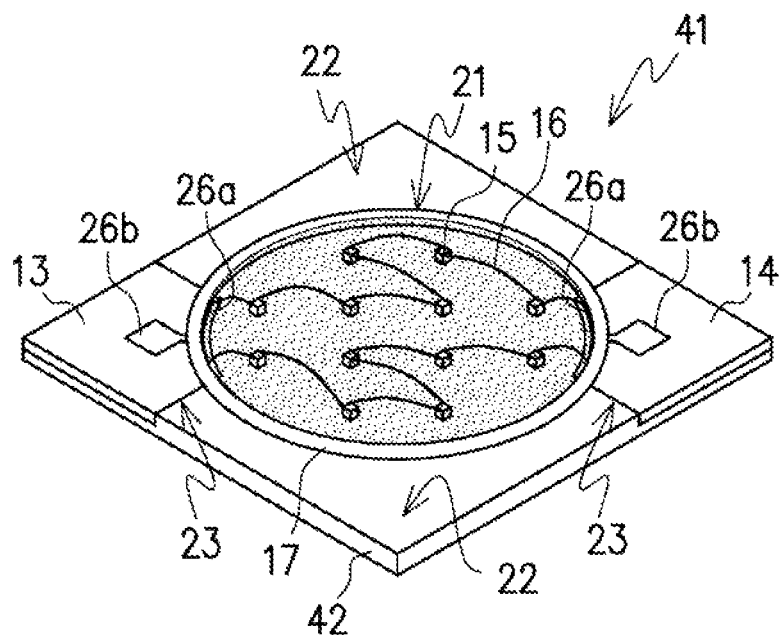
FIG. 7 is a perspective view of an LED lighting device according to a third embodiment.
Figure 8A:
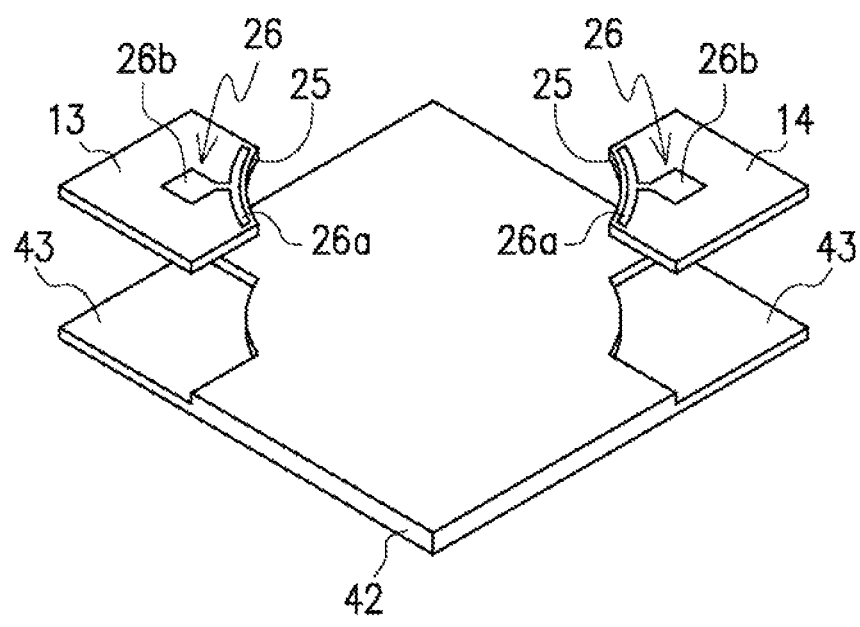
FIG. 8 is a perspective view (a) and a cross-sectional view (b) of a mounted substrate and a wiring substrate according to the third embodiment.
Figure 8B:
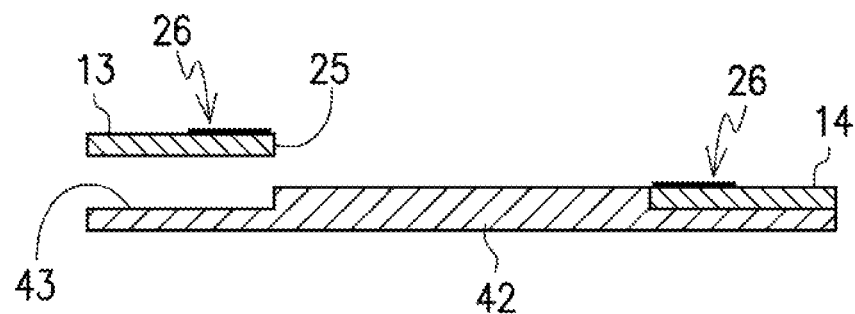
Figure 9:
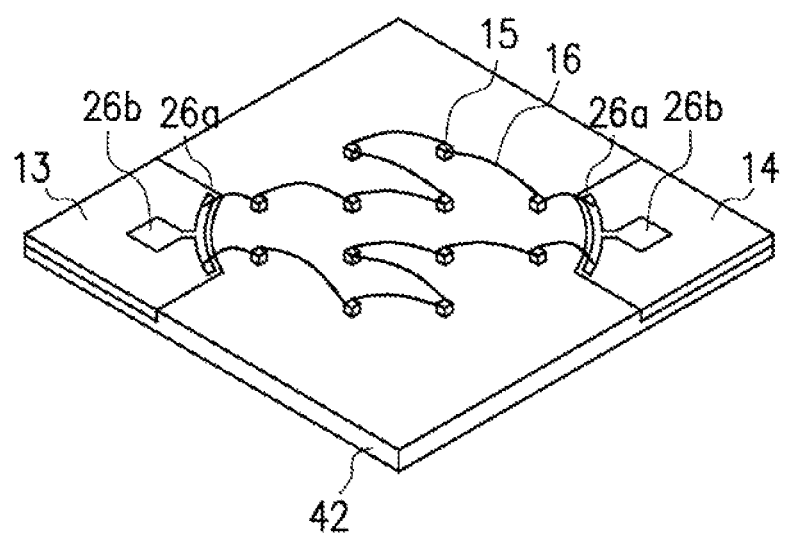
FIG. 9 is a perspective view illustrating an arrangement wiring step of light emitting elements according to the third embodiment.

FIGS. 7 to 9 illustrate an LED lighting device 41 according to the third embodiment. It is to be noted that like reference numerals designate corresponding or identical elements throughout the LED lighting device 31 according to this embodiment and the LED lighting device 11 according to the first embodiment, and these elements will not be elaborated upon here. As illustrated in FIG. 8, in the LED lighting device 41 according to this embodiment, two depressions 43 are provided on a mounted substrate 42. The pair of wiring substrates 13 and 14 are embedded in the depressions 43 so that the upper surfaces of the pair of wiring substrates 13 and 14 are flush with the upper surface of the mounted substrate 42. The depressions 43 are approximately the same in shape and thickness as the pair of wiring substrates 13 and 14. The pair of wiring substrates 13 and 14 are fitted into the depressions 43, which are located at opposite corners on the mounted substrate 42, using an adhesive or another binder. As a result, a flat stepless boundary is obtained between the upper surfaces of the wiring substrates 13 and 14 and the exposed region (the upper surface of the mounted substrate 42).

As illustrated in FIG. 9, a plurality of light emitting elements 15 are mounted at a center portion of the upper surface of the mounted substrate 42 fitted with the pair of wiring substrates 13 and 14. The plurality of light emitting elements 15 are connected in series to each other between the first electrode portions 26a of the pair of wiring substrates 13 and 14 through the wires 16. Then, as illustrated in FIG. 7, a partition frame 17 is formed as if to incorporate the first electrode portions 26a of the pair of wiring substrates 13 and 14. Then, the region defined within the partition frame 17 is filled with a light-transmitting sealing resin 18. In this embodiment, there is no step between the upper surface of the mounted substrate 42 and the upper surfaces of the pair of wiring substrates 13 and 14. This facilitates formation of the partition frame 17. The stepless configuration also enables the partition frame 17 to closely contact the mounted substrate 42, leaving no gap between the partition frame 17 and the mounted substrate 42. This effectively prevents a leakage of light emission from the light emitting region 21 to the exposed regions 22 and the wiring regions 23.

Figure 10:
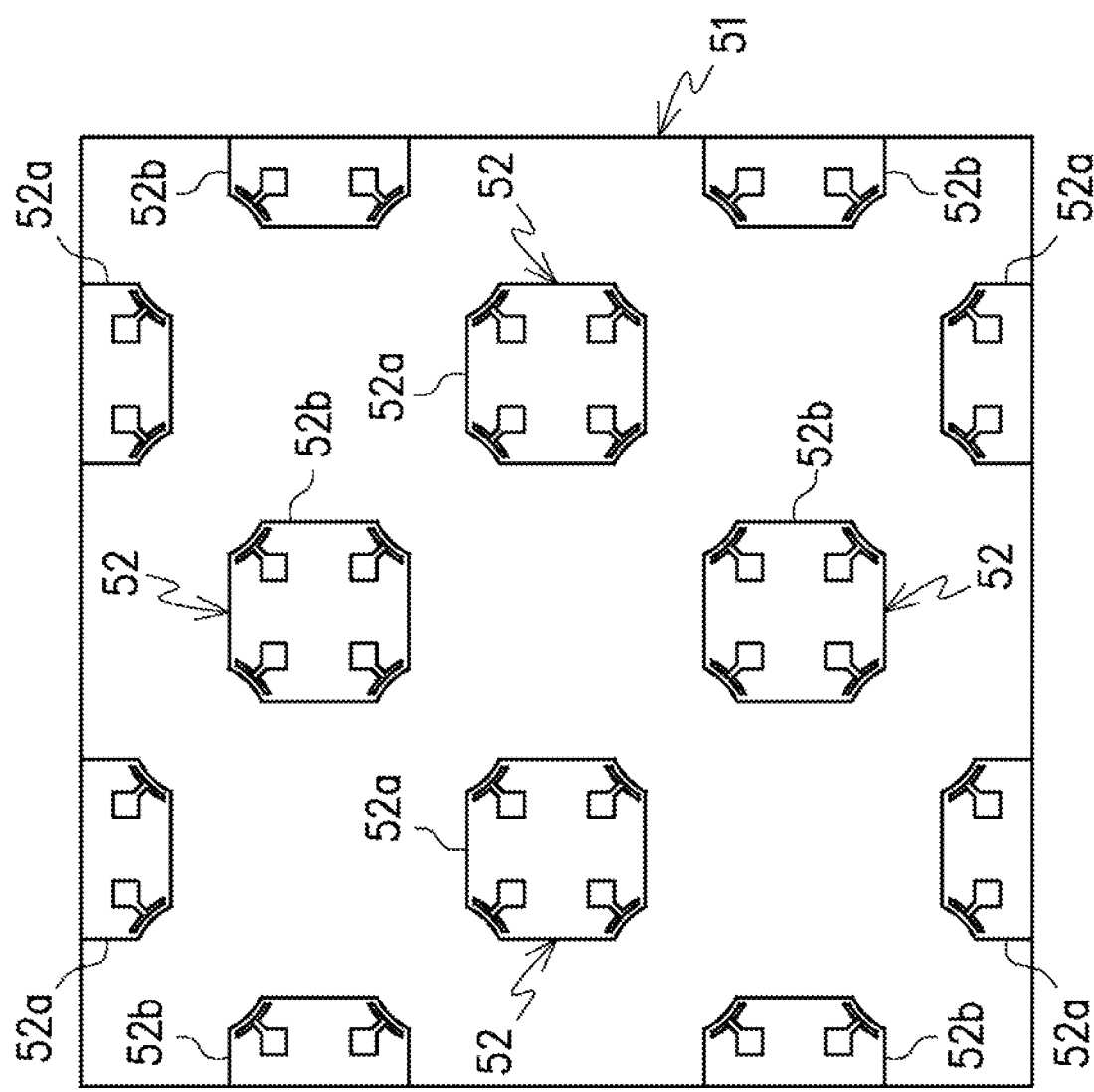
FIG. 10 is a plan view illustrating an aggregate wiring substrate arranging step of a method according to a fourth embodiment for manufacturing an LED lighting device.
Figure 11:
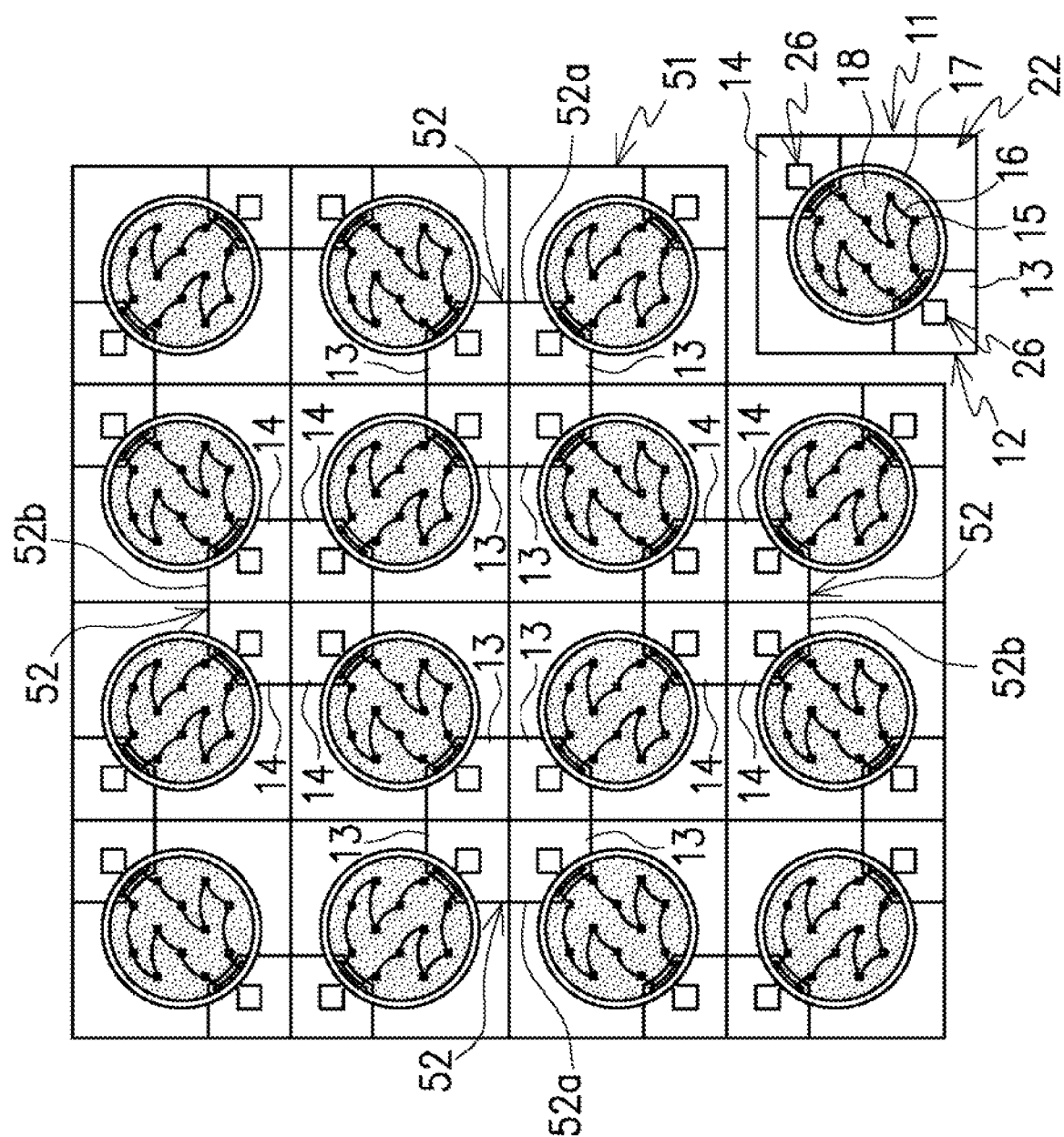
FIG. 11 is a plan view illustrating a cutting step of the method according to the fourth embodiment for manufacturing an LED lighting device.

FIGS. 10 and 11 illustrate part of a method according to the fourth embodiment for manufacturing an LED lighting device. In the method according to this embodiment for manufacturing an LED lighting device, an aggregate mounted substrate 51 is used to manufacture the LED lighting device according to the present application. The aggregate mounted substrate 51 is a collection of mounted substrates 12 integral to each other. It is to be noted that the method according to this embodiment for manufacturing an LED lighting device will be described with manufacturing of the LED lighting device 11 according to the first embodiment taken as an example. The method according to this embodiment for manufacturing an LED lighting device includes an aggregate wiring substrate arranging step, an arrangement wiring step, and a cutting step.

In the aggregate wiring substrate arranging step, aggregate wiring substrates 52, each of which includes a plurality of wiring substrates integral to each other, are arranged on the aggregate mounted substrate 51 in a lattice arrangement. In this embodiment, the aggregate wiring substrate 52 is made up of four wiring substrates 13 or four wiring substrates 14. As illustrated in FIG. 10, the aggregate wiring substrate arranging step according to this embodiment includes a step of arranging the aggregate wiring substrates 52 on the aggregate mounted substrate 51 in a rhombus lattice arrangement, that is, a step of arranging the aggregate wiring substrates 52 on the aggregate mounted substrate 51 so that adjacent four aggregate wiring substrates 52 are apexes of a rhombus.

More specifically, the aggregate wiring substrates 52 are arranged in the following manner. A first aggregate wiring substrate 52a includes four wiring substrates 13, and first aggregate wiring substrates 52a are arranged at equal spatial intervals in a vertical direction and a lateral direction of the aggregate mounted substrate 51. A second aggregate wiring substrate 52b includes four wiring substrates 14, and second aggregate wiring substrates 52b are displaced from the first aggregate wiring substrates 52a in the vertical direction and the lateral direction by half the spatial interval of the first aggregate wiring substrates 52a. By arranging the aggregate wiring substrates 52 on the aggregate mounted substrate 51 in this manner, the resulting LED lighting device 11 includes wiring substrates 13 and 14 at opposite corners on the mounted substrate 12.

As used herein, the spatial interval of the first aggregate wiring substrates 52a refers to an intercentral distance between adjacent first aggregate wiring substrates 52a. The same applies in the spatial intervals of other aggregate wiring substrates. Also as used herein, the vertical direction refers to a direction along one side surface of the mounted substrate 12 of the finally obtained LED lighting device 11. Also as used herein, the lateral direction refers to a direction orthogonal to the vertical direction. In this embodiment, the upward or downward direction of the aggregate mounted substrate 51 illustrated in FIGS. 10 and 11 is referred to as vertical direction. The same applies in the fifth to seventh embodiments, described later.

In the arrangement wiring step, as illustrated in FIG. 11, a plurality of light emitting elements 15 are mounted between the electrode portion 26 on the wiring substrate 13 and the electrode portion 26 on the wiring substrate 14. The wiring substrate 13 and the wiring substrate 14 are located at opposite corners on the mounted substrate 12 of the finally obtained LED lighting device 11. Then, as described in the first embodiment, the partition frame 17 is formed, and the region defined within the partition frame 17 is filled with the sealing resin 18. In the cutting step, at least one of the aggregate wiring substrate 52 and the aggregate mounted substrate 51 is cut to obtain an individual LED lighting device 11. More specifically, as illustrated in FIG. 11, the aggregate wiring substrate 52 and the aggregate mounted substrate 51 are cut through the center of the aggregate wiring substrate 52 in the vertical direction and the lateral direction of the aggregate mounted substrate 51 so that the aggregate wiring substrate 52 is divided into four. Thus, this embodiment uses the aggregate mounted substrate 51 and the aggregate wiring substrate 52, which includes a plurality of wiring substrates. This ensures that the LED lighting device 11 is efficiently manufactured in large quantities.

Figure 12:
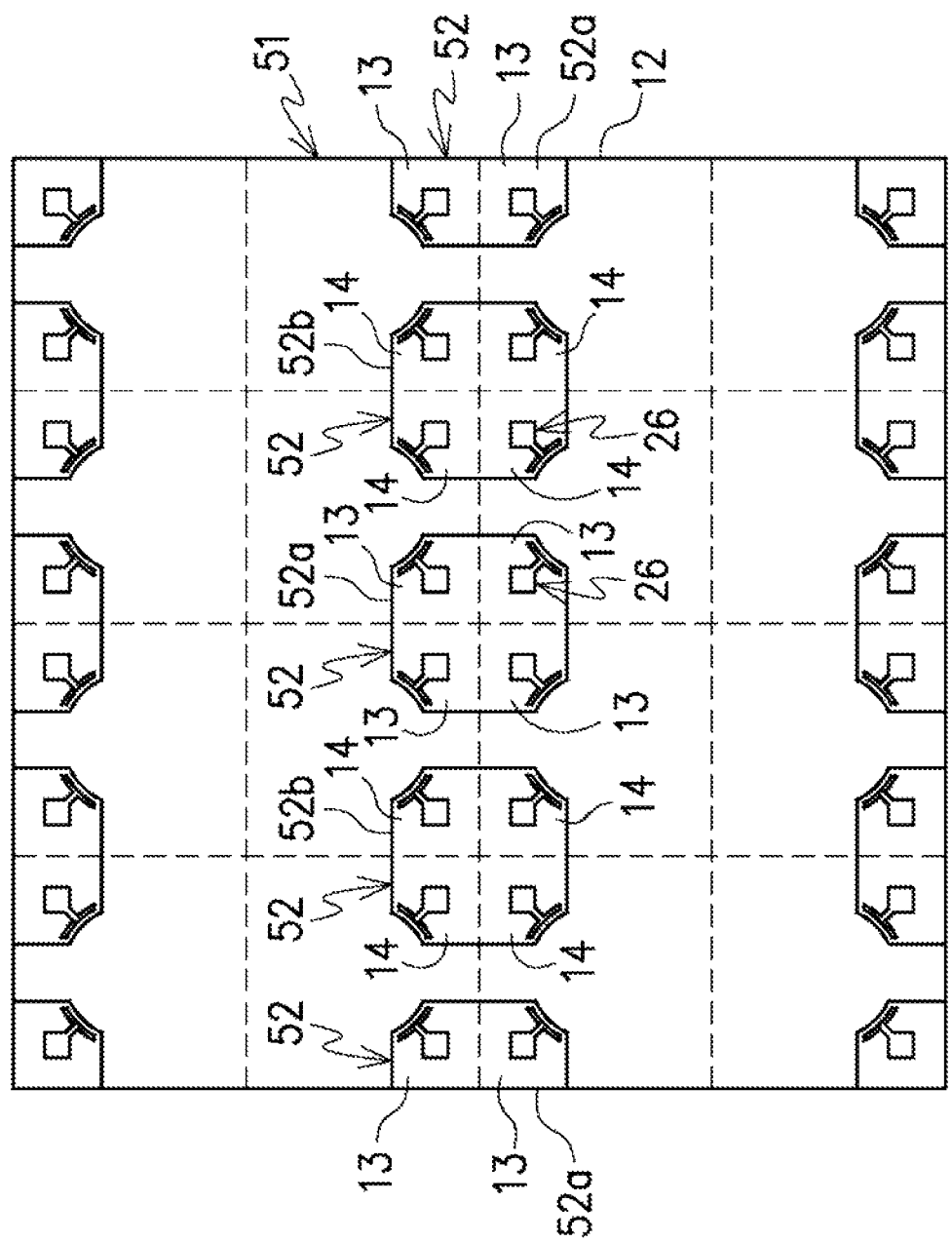
FIG. 12 is a plan view illustrating an aggregate wiring substrate arranging step of a method according to a fifth embodiment for manufacturing an LED lighting device.

FIG. 12 illustrates part of a method according to the fifth embodiment for manufacturing an LED lighting device. It is to be noted that in the description of this embodiment, a description already provided in the fourth embodiment will be omitted to avoid redundancy. The same applies in the description of the fifth to seventh embodiments, described later. As illustrated in FIG. 12, the aggregate wiring substrate arranging step of the method according to this embodiment for manufacturing an LED lighting device includes a step of arranging the aggregate wiring substrates 52 in a rectangular lattice arrangement, that is, a step of arranging the aggregate wiring substrates 52 on the aggregate mounted substrate 51 at equal spatial intervals in the vertical direction and at equal spatial intervals in the lateral direction so that the spatial interval in the vertical direction and the spatial interval in the lateral direction are different from each other.

More specifically, the aggregate wiring substrates 52 are arranged in the following manner. The first aggregate wiring substrates 52a, each of which includes four wiring substrates 13, are arranged at equal spatial intervals in the vertical direction and at equal spatial intervals in the lateral direction of the aggregate mounted substrate 51. The second aggregate wiring substrates 52b, each of which includes four wiring substrates 14, are displaced from the first aggregate wiring substrates 52a in the lateral direction by half the spatial interval of the first aggregate wiring substrates 52a. By arranging the aggregate wiring substrates 52 on the aggregate mounted substrate 51 in this manner, the resulting LED lighting device includes wiring substrates 13 and 14 located at adjacent corners on the mounted substrate 12, as opposed to the other embodiments. It is to be noted that since the wiring substrates 13 and 14 are the same members, the aggregate wiring substrate 52 may be made up of two wiring substrates 13 and two wiring substrates 14.

In the arrangement wiring step, a plurality of light emitting elements are mounted between the electrode portion 26 on the wiring substrate 13 and the electrode portion 26 on the wiring substrate 14 of the finally obtained LED lighting device. The wiring substrate 13 and the wiring substrate 14 are located at adjacent corners on the mounted substrate 12. Then, a partition frame is formed, and the region defined within the partition frame is filled with a sealing resin. Then, in the cutting step, as indicated by the dotted lines in FIG. 12, the aggregate wiring substrate 52 and the aggregate mounted substrate 51 are cut through the center of the aggregate wiring substrate 52 in the vertical direction and the lateral direction of the aggregate wiring substrate 52 so that the aggregate wiring substrate 52 is divided into four. In this manner, an individual LED lighting device is obtained. It is to be noted that the steps after the arrangement wiring step are omitted.

Figure 13:
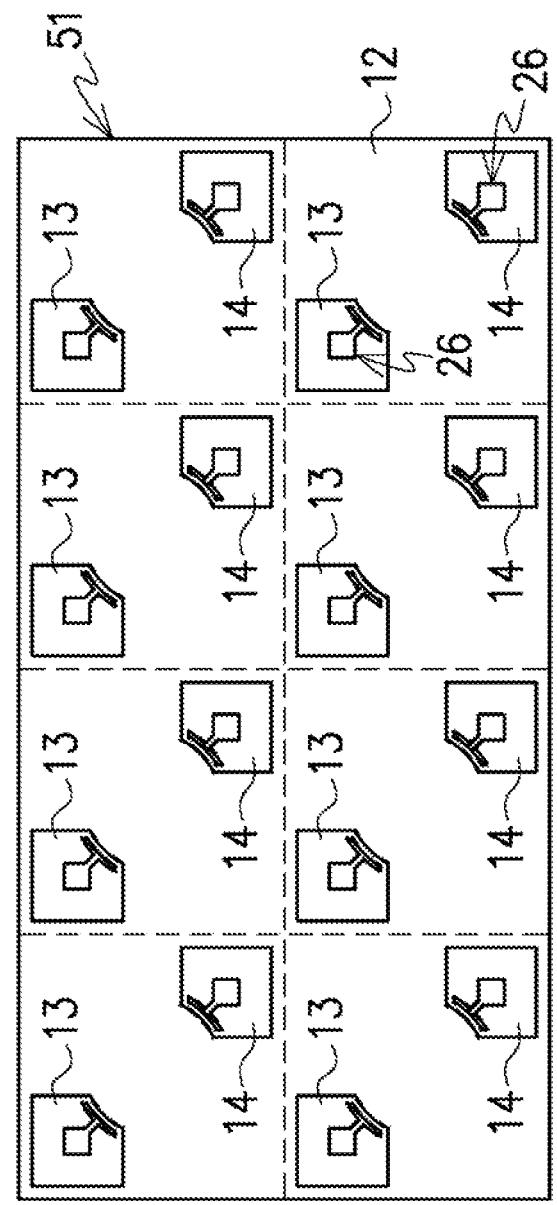
FIG. 13 is a plan view illustrating a wiring substrate arranging step of a method according to a sixth embodiment for manufacturing an LED lighting device.

FIG. 13 illustrates part of a method according to the sixth embodiment for manufacturing an LED lighting device. The method according to this embodiment for manufacturing an LED lighting device includes a wiring substrate arranging step, an arrangement wiring step, and a cutting step. As illustrated in FIG. 13, in the wiring substrate arranging step, wiring substrates 13 and 14 are located on the aggregate mounted substrate 51 at opposite corners on the mounted substrate 12 of the finally obtained LED lighting device.

In the arrangement wiring step, a plurality of light emitting elements are mounted between the electrode portion 26 on the wiring substrate 13 and the electrode portion 26 on the wiring substrate 14. The wiring substrate 13 and the wiring substrate 14 are located at opposite corners on the mounted substrate 12 of the finally obtained LED lighting device. Then, a partition frame is formed, and the region defined within the partition frame is filled with a sealing resin. Then, in the cutting step, as illustrated in FIG. 13, the aggregate mounted substrate 51 is cut in the vertical direction and the lateral direction of the aggregate wiring substrate 52, as indicated by the dotted lines between the wiring substrates 13 and 14 of adjacent mounted substrates 12. In this manner, an individual LED lighting device is obtained. It is to be noted that the steps after the arrangement wiring step are omitted.

Figure 14:
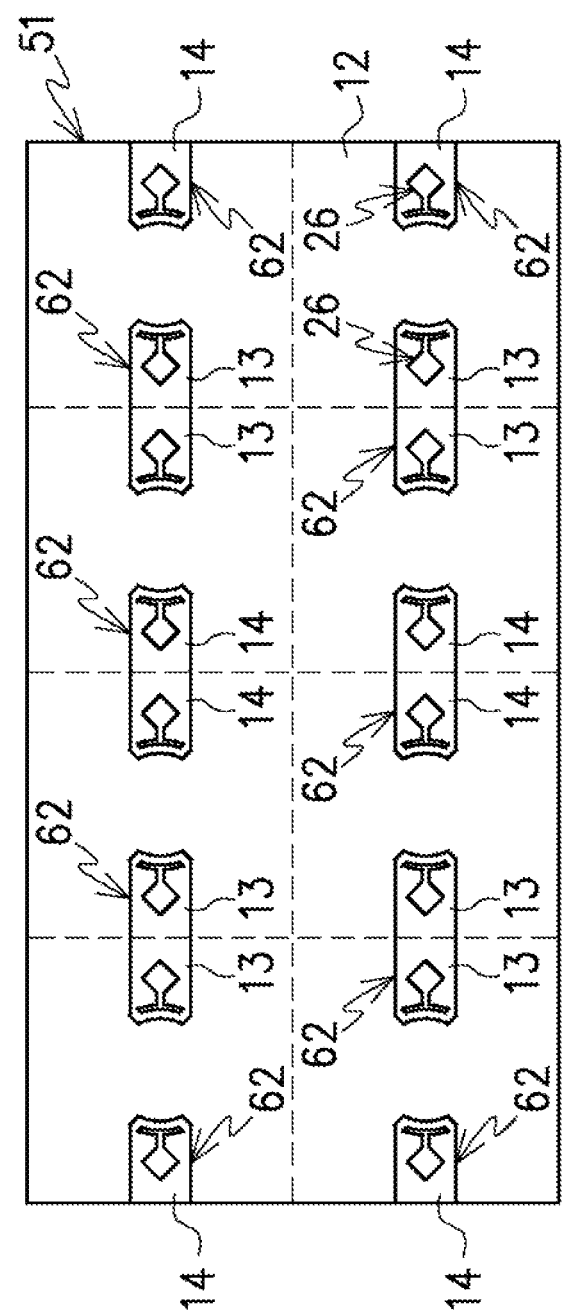
FIG. 14 is a plan view illustrating an aggregate wiring substrate arranging step of a method according to a seventh embodiment for manufacturing an LED lighting device.

FIG. 14 illustrates part of a method according to the seventh embodiment for manufacturing an LED lighting device. The LED lighting device obtained by the manufacturing method according to the seventh embodiment includes wiring substrates 13 and 14 at center portions of two opposite sides of the four sides of the mounted substrate 12. The method according to this embodiment for manufacturing an LED lighting device includes an aggregate wiring substrate arranging step, an arrangement wiring step, and a cutting step. This embodiment uses aggregate wiring substrates 62, each of which includes a pair of wiring substrates 13 or a pair of wiring substrates 14.

As illustrated in FIG. 14, in the method according to this embodiment for manufacturing an LED lighting device, the aggregate wiring substrate arranging step includes a step of arranging the aggregate wiring substrates 62 in a square lattice arrangement, that is, a step of arranging the aggregate wiring substrates 62 on the aggregate mounted substrate 51 so that the spatial interval of the aggregate wiring substrates 62 in the vertical direction is the same as the spatial interval of the aggregate wiring substrates 62 in the lateral direction. By arranging the aggregate wiring substrates 62 on the aggregate mounted substrate 51 in this manner, the resulting LED lighting device includes wiring substrates 13 and 14 located at two opposite sides of the four sides of the mounted substrate 12. It is to be noted that since the wiring substrates 13 and 14 are the same members, the aggregate wiring substrate 62 may be made up of one wiring substrate 13 and one wiring substrate 14.

In the arrangement wiring step, a plurality of light emitting elements are mounted between the electrode portion 26 on the wiring substrate 13 and the electrode portion 26 on the wiring substrate 14 of the finally obtained LED lighting device. The wiring substrate 13 and the wiring substrate 14 face each other at two opposite sides of the mounted substrate 12. Then, a partition frame is formed, and the region defined within the partition frame is filled with a sealing resin. Then, in the cutting step, as indicated by the dotted lines in FIG. 14, the aggregate wiring substrate 62 and the aggregate mounted substrate 51 are cut in the vertical direction through the center of the aggregate wiring substrate 62. Then, the aggregate mounted substrates 51 are cut in the lateral direction through the centers of the resulting two aggregate wiring substrates 62 aligned next to each other in the vertical direction. In this manner, an individual LED lighting device is obtained. It is to be noted that the steps after the arrangement wiring step are omitted.

As has been described hereinbefore, in the LED lighting device according to the present application, the occupation area of the wiring regions located around the light emitting region is minimized. This ensures that the upper surface of the mounted substrate around the light emitting region is widely exposed directly to outside the LED lighting device. This ensures that a heat discharge effect is also obtained at the exposed portion of the upper surface of the mounted substrate. This further increases the light emitting efficiency of the LED lighting device, and promotes the attempt to make an LED lighting device smaller in size. Also, the method according to the present application for manufacturing an LED lighting device uses: aggregate wiring substrates each including a plurality of wiring substrates integral to each other; and an aggregate mounted substrate including a collection of mounted substrates integral to each other. This ensures that the LED lighting device according to the present application is efficiently manufactured in large quantities.

DESCRIPTION OF THE REFERENCE NUMERAL

11 LED lighting device
12 Mounted substrate
12a, 12b Corner
13, 14 Wiring substrate
15 Light emitting element
16 Wire
17 Partition frame
18 Sealing resin
21 Light emitting region
22 Exposed region
23 Wiring region
25 Cutout portion
26 Electrode portion
26a First the electrode portion
26b Second electrode portion
31 LED lighting device
32 Cover member
41 LED lighting device
42 Mounted substrate
43 Depression
51 Aggregate mounted substrate
52 Aggregate wiring substrate
52a First aggregate wiring substrate
52b Second aggregate wiring substrate
62 Aggregate wiring substrate

What is claimed is:

1. An LED lighting device comprising:
a plurality of light emitting elements;
a mounted substrate on which the plurality of light emitting elements are mounted, the mounted substrate having a rectangular shape and being made of a metal material with high thermal conductivity; and
a pair of wiring substrates made of an insulating resin located on the mounted substrate and fixed to the mounted substrate via an adhesive, each of the pair of wiring substrates comprising an electrode portion on an upper surface thereof, the electrode portion being configured to supply a current to the plurality of light emitting elements from outside the LED lighting device,
wherein, on an upper surface of the mounted substrate, the mounted substrate comprises:
a light emitting region in which the plurality of light emitting elements are mounted;
an exposed region which is located on an outer side of the light emitting region and through which the upper surface of the mounted substrate is exposed; and
a pair of wiring regions located on the outer side of the light emitting region and in which the pair of wiring substrates are located, the pair of wiring regions having an area smaller than an area of the exposed region,
wherein the mounted substrate further comprises a pair of depressions into which the pair of wiring substrates are configured to be fitted, and in a state in which the pair of wiring substrates are fitted into the pair of depressions, the upper surface of the mounted substrate is flush with the upper surface of one of the pair of wiring substrates and the upper surface of the other of the pair of wiring substrates, and
wherein:
the light emitting region is located at a center portion of the upper surface of the mounted substrate and partitioned from the exposed region and the pair of wiring regions by a partition frame;
the exposed region is configured to discharge heat generated in the light emitting region outside the LED lighting device from the upper surface of the mounted substrate; and
the plurality of light emitting elements are connected to each other through only wires between one of the pair of wiring substrates and another of the pair of wiring substrates, one of the plurality of light emitting elements is mounted at a first position adjacent to the one of the pair of wiring substrates and has a wired connection with the electrode portion on the upper surface of the one of the pair of wiring substrates, and another of the plurality of light emitting elements is mounted at a second position adjacent to the other of the pair of wiring substrates and has a wired connection with the electrode portion on the upper surface of the other of the pair of wiring substrates.

2. The LED lighting device according to claim 1, wherein the pair of wiring regions are located at opposite corners on the mounted substrate.

3. The LED lighting device according to claim 1, wherein:
the partition frame partitions the light emitting region from the exposed region and the pair of wiring regions; and
the partition frame has a circular shape.

4. The LED lighting device according to claim 1, wherein the light emitting region is filled with a light-transmitting sealing resin covering the plurality of light emitting elements.

5. The LED lighting device according to claim 1, wherein the electrode portion of the one of the pair of wiring substrates comprises:
a first electrode portion having the wired connection with the one of the plurality of light emitting elements; and
a second electrode portion configured to supply the current, through the first electrode portion of the one of the pair of wiring substrates, to the plurality of light emitting elements, and
wherein the electrode portion of the other of the pair of wiring substrates comprises:
a first electrode portion having the wired connection with the other of the plurality of light emitting elements; and
a second electrode portion configured to supply the current, through the first electrode portion of the other of the pair of wiring substrates, to the plurality of light emitting elements.

6. The LED lighting device according to claim 5, wherein:
the one of the pair of wiring substrates has an outer shape defined along an outer shape of the first electrode portion of the one of the pair of wiring substrates; and
the other of the pair of wiring substrates has an outer shape defined along an outer shape of the first electrode portion of the other of the pair of wiring substrates.

7. The LED lighting device according to claim 1, wherein the pair of wiring regions are located so as to oppose each other on the mounted substrate.

8. The LED lighting device according to claim 1, wherein each of the pair of wiring substrates has a side surface facing toward the light emitting region, and the side surface fits a shape of the partition frame.

9. The LED lighting device according to claim 1, wherein the partition frame comprises respective portions that step over the pair of wiring substrates.

10. The LED lighting device according to claim 8, wherein the partition frame comprises one portion positioned along the side surface of the one of the pair of wiring substrates and another portion positioned along the side surface of the other of the pair of wiring substrates.

11. The LED lighting device according to claim 5, wherein each of the first electrode portion of the one of the pair of wiring substrates and the first electrode portion of the other of the pair of wiring substrates is covered with a cover member.

* * * * *